(12) United States Patent
Okamoto et al.

(10) Patent No.: US 9,144,186 B2
(45) Date of Patent: Sep. 22, 2015

(54) METHOD OF MOUNTING ELECTRONIC PARTS ON SURFACE MOUNTING SUBSTRATE USING A FILM RESIST STANDOFF

(71) Applicant: FUJI ELECTRIC FA COMPONENTS & SYSTEMS CO., LTD., Chuo-ku, Tokyo (JP)

(72) Inventors: Kokichi Okamoto, Ohtawara (JP); Takahiro Taguchi, Kounosu (JP)

(73) Assignee: FUJI ELECTRIC FA COMPONENTS & SYSTEMS CO., LTD., Tokyo (JP)

(*) Notice: Subject to any disclaimer, the term of this patent is extended or adjusted under 35 U.S.C. 154(b) by 0 days.

(21) Appl. No.: 14/505,046

(22) Filed: Oct. 2, 2014

(65) Prior Publication Data

US 2015/0014398 A1 Jan. 15, 2015

Related U.S. Application Data

(63) Continuation of application No. PCT/JP2013/002479, filed on Apr. 11, 2013.

(30) Foreign Application Priority Data

May 18, 2012 (JP) .................................. 2012-114998

(51) Int. Cl.
*B23K 31/00* (2006.01)
*H05K 13/04* (2006.01)
(Continued)

(52) U.S. Cl.
CPC .............. *H05K 13/0465* (2013.01); *B23K 1/20* (2013.01); *H05K 3/303* (2013.01); *H05K 3/3452* (2013.01); *H05K 3/3442* (2013.01); *H05K 2201/099* (2013.01); *H05K 2201/2036* (2013.01)

(58) Field of Classification Search
CPC .................................. B23K 1/0016; B23K 1/20
USPC ........................................ 228/180.22, 248.1
See application file for complete search history.

(56) References Cited

U.S. PATENT DOCUMENTS 5,315,070 A * 5/1994 Maiwald ....................... 174/250
5,684,677 A * 11/1997 Uchida et al. ................. 361/770

(Continued)

FOREIGN PATENT DOCUMENTS

| JP | H10-135614 A | 5/1998 |
| JP | 2003-142812 A | 5/2003 |

(Continued)

OTHER PUBLICATIONS

PCT, "International Search Report for International Application No. PCT/JP2013/002479".

*Primary Examiner* — Kiley Stoner
*Assistant Examiner* — Carlos Gamino
(74) *Attorney, Agent, or Firm* — Manabu Kanesaka

(57) ABSTRACT

A method of mounting electronic parts on a surface mounting substrate includes a step of forming a film resist layer by applying a resist with a film coating device to amounting surface of a surface mounting substrate formed with a wiring pattern including a pair of lands to mount an electronic part; precuring the formed film resist layer; exposing, by using a mask, inner side regions of the film resist layer, the inner side regions defining the exposure regions and another region defining non-exposure region; etching away the film resist layer in the non-exposure regions and forming film resist layers in the inner side regions; post curing the film resist layers; printing solder pastes in regions on the lands excluding the inner side regions; and placing the electronic part on the solder pastes and reflow-soldering thereon.

6 Claims, 2 Drawing Sheets

(51) Int. Cl.
　　　*H05K 3/30*　　(2006.01)
　　　*B23K 1/20*　　(2006.01)
　　　*H05K 3/34*　　(2006.01)

(56) References Cited

U.S. PATENT DOCUMENTS

| | | | |
|---|---|---|---|
| 6,445,589 B2 * | 9/2002 | Chengalva | 361/760 |
| 6,449,836 B1 * | 9/2002 | Miyake et al. | 29/830 |
| 6,492,737 B1 * | 12/2002 | Imasu et al. | 257/778 |
| 6,739,039 B2 * | 5/2004 | Choi et al. | 29/829 |
| 8,716,741 B2 * | 5/2014 | Kashimura et al. | 257/99 |
| 2007/0007323 A1 * | 1/2007 | Russell et al. | 228/246 |
| 2011/0037174 A1 * | 2/2011 | Nikaido et al. | 257/737 |
| 2013/0249073 A1 * | 9/2013 | Chen et al. | 257/706 |

FOREIGN PATENT DOCUMENTS

| | | |
|---|---|---|
| JP | 2004-207532 A | 7/2004 |
| JP | 2005-251904 A | 9/2005 |
| JP | 2005-327914 A | 11/2005 |

* cited by examiner

METHOD OF MOUNTING ELECTRONIC PARTS ON SURFACE MOUNTING SUBSTRATE USING A FILM RESIST STANDOFF

CROSS REFERENCE

The present application is a continuation application of an International Application No. PCT/JP2013/002479 filed Apr. 11, 2013, and claims priority from Japanese Application No. 2012-114998 filed May 18, 2012.

TECHNICAL FIELD

The present invention relates to a method of mounting electronic parts on a surface mounting substrate whereby the electronic parts are surface mounted on the surface mounting substrate.

BACKGROUND ART

With this kind of surface mounting substrate, when reflow-soldering a chip part such as a capacitor, which has no lead wire portion, to the surface mounting substrate, the solder height to the bottom of the chip, that is, stand-off height is increased in order to relax the displacement gap between the surface mounting substrate and the chip part due to thermal strain of the surface mounting substrate.

In order to secure the stand-off height, it is heretofore known to provide a solder wetting-up suppression structure configured so that in order to prevent solder from wetting up along the end face electrodes of a substrate surface mount part such as a chip part having end face electrodes, all or one portion of the end face electrodes is covered with a material which is not wetted with the solder (refer to PTL 1).

CITATION LIST

Patent Literature

PTL 1: JP-A-2005-251904

SUMMARY OF INVENTION

Technical Problem

Meanwhile, in the heretofore known example described in PTL 1, a solder wetting-up suppression structure, such as a cover, which suppresses solder wetting-up is provided on the end face electrodes of the substrate surface mount part.

However, the heretofore known example has the unsolved problem that it is necessary to provide the solder wetting-up suppression structure on the end face electrodes of the substrate surface mount part, thus leading to an increase in man-hours.

Also, it is possible to suppress the solder wetting-up onto the end face electrodes of the substrate surface mount part, but there is the unsolved problem that the stand-off height also depends on the amount of application of solder paste, and it is not possible to secure constant stand-off height.

Therefore, the invention has been contrived focusing attention on the heretofore described unsolved problems of the heretofore known example. The invention has an object to provide a method of mounting electronic parts on a surface mounting substrate whereby it is possible to accurately set the stand-off height of a chip part.

Solution to Problem

In order to achieve the heretofore described object, a first aspect of a method of mounting electronic parts on a surface mounting substrate according to the invention is such that the method includes a step of forming a thick film resist layer by applying a resist with a thick film coating device to a mounting surface of a surface mounting substrate formed with a wiring pattern including a pair of lands to mount an electronic part; a step of precuring the formed thick film resist layer; a step of exposing, by a mask, inner side regions of the thick film resist layer, which are on the pair of lands and to be below the electronic part, the inner side regions of the thick film resist layer defining the exposure regions and the other remaining regions of the thick film resist layer defining non-exposure regions; a step of etching away the thick film resist layer in the non-exposure regions and forming thick film resist layers in the inner side regions which are on the pair of lands and to be below the electronic part; a step of post curing the thick film resist layers; a step of printing solder pastes in regions on the lands excluding the inner side regions; and a step of placing the electronic part on the solder pastes and reflow-soldering thereon.

According to the first aspect, a configuration is such that a thick film resist layer is formed, using a resist such as a liquid photoimageable solder resist or a dry photoimageable solder resist, in inner side regions on a pair of lands on which to mount a chip part having electrode portions at two ends thereof, with a thick film coating device, and after solder pastes are printed on the lands from which the thick film resist layer is removed, reflow-soldering is carried out. Because of this, it is possible to secure stand-off height, which is a constant distance, between the pair of lands and the electronic part.

Also, a second aspect of the method of mounting electronic parts on the surface mounting substrate according to the invention is such that the resist has a filler mixed therein.

According to the second aspect, as a filler is mixed in the resist, it is possible to produce the effect of maintaining the resist in shape due to the filler, thus forming a thick film resist layer large in thickness.

Also, a third aspect of the method of mounting electronic parts on the surface mounting substrate according to the invention is such that the thick film coating device is formed of one of a curtain coater, a spray coater, or a screen printer.

According to the third aspect, by forming the thick film coating device from one of a curtain coater, a spray coater, or a screen printer, it is possible to adjust the thickness of the thick film resist layer with high accuracy. In particular, when using a curtain coater or a spray coater, it is possible to adjust the thickness of the thick film resist layer with high accuracy by controlling the conveying speed of a conveyor on which the surface mounting substrate is placed.

A fourth aspect of the method of mounting electronic parts on the surface mounting substrate according to the invention is such that the method includes a step of forming a thick film resist layer by laminating a dry film photoresist acting as a dry photoimageable solder resist to a mounting surface of a surface mounting substrate formed with a wiring pattern including a pair of lands to mount an electronic part; a step of exposing, by a mask, inner side regions of the formed thick film resist layer, which are on the lands and to be below the electronic part, the inner side regions defining the exposure regions and the other regions of the formed thick film resist layer defining non-exposure regions; a step of developing and removing the thick film resist layer in the non-exposure regions and forming thick film resist layers in the inner side regions which are on the pair of lands and to be below the electronic part; a step of post curing the thick film resist layers; a step of printing solder pastes in regions on the lands excluding the inner side regions; and a step of placing the electronic part on the solder pastes and reflow-soldering thereon.

According to the fourth aspect, as a thick film resist layer is formed in inner side regions, which are on a pair of lands and to be below the part on the mounting substrate, using a dry film photoresist, it is possible to accurately and easily form a thick film resist layer without using an expensive coating device.

Advantageous Effects of Invention

According to the invention, a resist is applied with a thick film coating device to inner side regions on a pair of lands formed on the surface mounting substrate, or thick film resist layers are formed in the inner side regions using a dry film photoresist, and after solder pastes are printed on outer side regions on the lands on which the thick film resist layers are formed, reflow-soldering is carried out. Because of this, it is possible to accurately secure the stand-off height between the electronic part and the lands with the thick film resist layers.

DESCRIPTION OF EMBODIMENTS

Hereafter, a description will be given, based on the drawings, of an embodiment of the invention.

Figure 1:
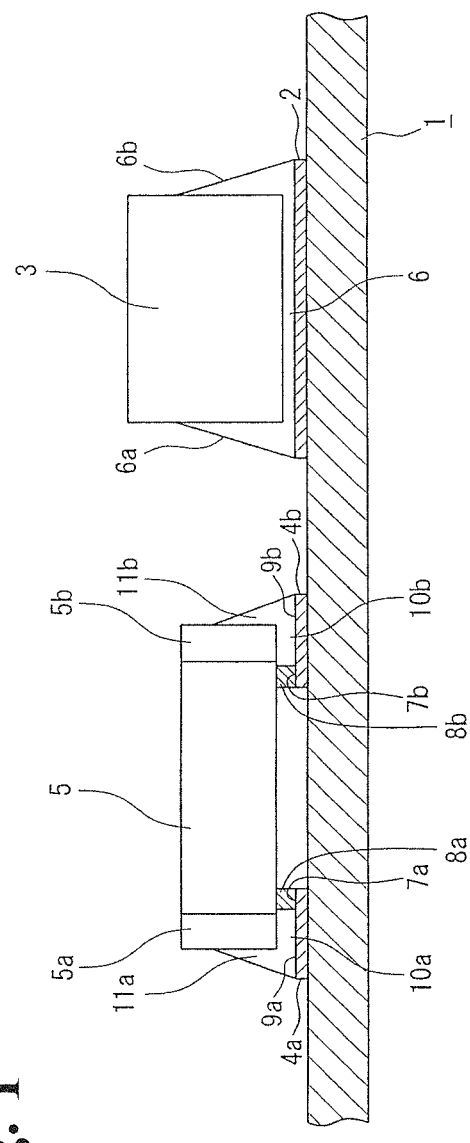
FIG. 1 is a sectional view showing a surface mounting substrate according to the invention.

FIG. 1 is a sectional view showing a surface mounting substrate according to the invention, and FIGS. 2(a)-2(f) are illustrations showing an electronic part mounting method according to the invention.

In the drawings, reference 1 is a surface mounting substrate, formed of one plate of base material, on which are surface mounted electronic parts configuring, for example, a drive circuit which drives an electromagnet unit of an electromagnetic contactor. The surface mounting substrate 1 is such that a large part 3 formed of a semiconductor component, such as a rectifier diode, a Schottky diode, or a field effect transistor, is reflow-soldered to a land 2 on a wiring pattern formed on the front surface of the surface mounting substrate 1, and a chip part 5, such as a resistor, a capacitor, or a coil, is reflow-soldered to a pair of other lands 4a and 4b.

Herein, a solder layer 6 is formed all over between the mutually facing mount surface of the large part 3 and land 2 surface. The solder layer 6 has wetting-up portions 6a and 6b formed one on either side surface of the large part.

As opposed to this, thick film resist layers 8a and 8b are formed in inner side regions 7a and 7b, on the lands 4a and 4b of the chip part 5, which are opposite to the bottom of the chip part 5 and on the opposite surfaces of the two lands 4a and 4b to the bottom of the chip part 5. Also, solder layers 10a and 10b are formed in outer side regions 9a and 9b on the two lands 4a and 4b on the opposite sides to the inner side regions 7a and 7b. The solder layers 10a and 10b have wetting-up portions 11a and 11b formed on the sides of electrode portions 5a and 5b at two ends of the chip portion 5.

Further, it is possible to easily surface mount the large part 3 on the surface mounting substrate 1 by carrying out reflow-soldering in the way described hereafter.

Figure 2A:
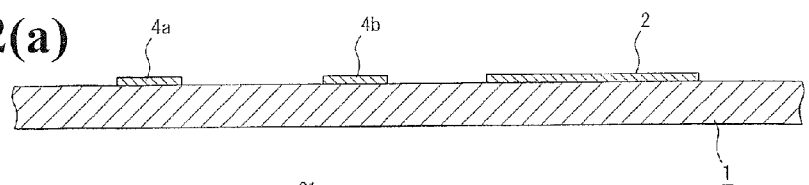
FIGS. 2(a)-2(f) are illustrations showing a method of mounting electronic parts on the surface mounting substrate according to the invention.

As opposed to this, in order to surface mount the chip part 5 on the surface mounting substrate 1, firstly, the surface mounting substrate 1 on which are formed the lands 2, 4a, and 4b on which to mount the large part 3 and chip part 5 is prepared by forming a wiring pattern formed of, for example, copper foil, as shown in FIG. 2(a).

Figure 2B:
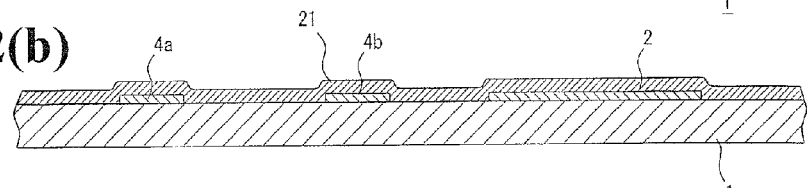

Next, as shown in FIG. 2(b), a thick film resist layer 21 is formed on the surface mounting substrate 1 by applying a liquid photoimageable solder resist formed of a common photosensitive resin composition to the mounting surface with a thick film coating device configured of one of, for example, a curtain coater or a spray coater. Herein, in the thick film coating device, the surface mounting substrate 1 is placed on a conveyor opposite to a coating portion which ejects the resist, and the conveying speed of the conveyor is adjusted, thereby forming the thick film resist layer 21 of a desired thickness (for example, 100 μm). In order to form the thick film resist layer 21, a liquid photoimageable solder resist may be formed by screen printing using a screen printer.

Next, precure wherein the surface mounting substrate on which is formed the thick film resist layer 21 is heated, for example, at on the order of 80° C. for 20 to 30 minutes is carried out.

Figure 2C:
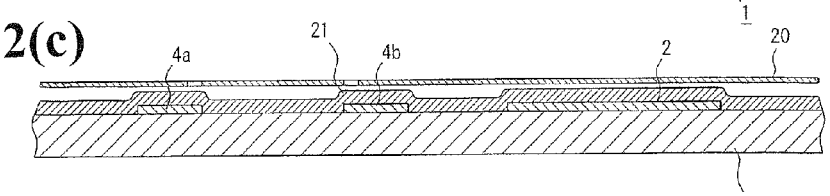

Next, as shown in FIG. 2(c), exposure wherein the surface mounting substrate is irradiated with ultraviolet rays using a mask 20 such as a negative film. Herein, the resist in the inner side regions 7a and 7b on the lands 4a and 4b is cured with the inner side regions 7a and 7b as exposure regions irradiated with ultraviolet rays, and curing of the resist in the other regions is suppressed with the other regions as non-exposure regions in which irradiation with ultraviolet rays is interrupted.

Figure 2D:
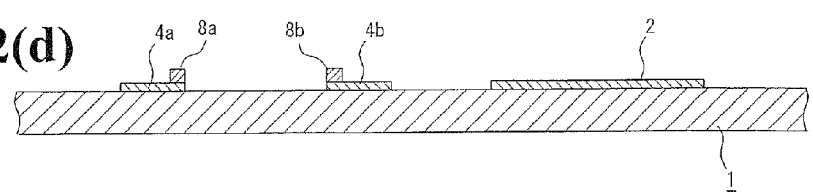

Next, as shown in FIG. 2(d), an etching process is carried out using an alkaline developer, and the thick film resist layer in the non-exposure regions is etched away, thus forming thick film resist layers 8a and 8b in the inner side regions 7a and 7b which are on the pair of lands 4a and 4b and to be below the chip part 5.

Next, post cure wherein the thick film resist layers 8a and 8b are heated, for example, at 150° C. for on the order of 50 to 60 minutes and completely cured is carried out.

Figure 2E:
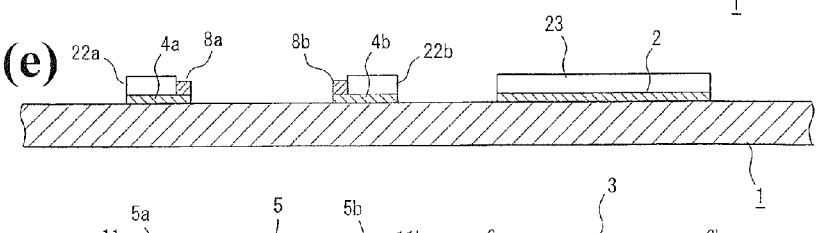

Next, as shown in FIG. 2(e), lead-free solder pastes 22a and 22b are, for example, screen printed on the outer side regions 9a and 9b excluding the inner side regions 7a and 7b on the lands 4a and 4b. At this time, a lead-free solder paste 23 is also printed on the land 2 for the large part 3.

Figure 2F:
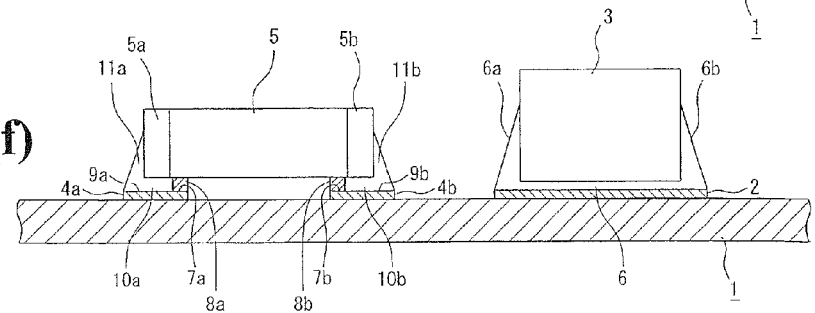

Next, as shown in FIG. 2(f), after the chip part 5 is placed on the top portions of the lead-free solder pastes 22a and 22b and thick film resist layers 8a and 8b, and the large part 3 is placed on the lead-free solder paste 23, reflow-soldering is carried out to form the solder layers 10a, 10b, and 6, thus completing the surface mounting of the large part 3 and chip part 5 on the surface mounting substrate 1.

Herein, the reflow-soldering is heated in a reflow furnace after the large part 3 and chip part 5 are placed on the lead-free solder pastes 23, 22a, and 22b. At this time, preheating and main heating are carried out in the reflow furnace. The preheating is such that the substrate and parts are preheated to, in general, on the order of 150° C. to 170° C. in order to carry out relaxation of a sudden thermal shock to the parts, promotion of activation of fluxes, vaporization of an organic solvent, and the like. Subsequently, the main heating wherein the temperature is raised for a short time to a high temperature (in general, 220° C. to 260° C.) at which the solder melts. In the main heating, the melting temperature varies according to a solder component composition, but in the case of lead-free solder, it is necessary to raise the temperature to the high temperature. Subsequently, the surface mounting substrate 1 on which are mounted the large part 3 and chip part is cooled, thus forming the solder layers 6, 10a, and 10b.

Further, the surface mounting substrate 1 on which are mounted the large part 3 and chip part 5 is installed in, for example, an electromagnetic contactor inserted in high-voltage and high-current direct current path, thus controlling energization of an exciting coil of an electromagnet unit of the electromagnetic contactor.

In this way, according to the embodiment, the thick film resist layers 8a and 8b are formed in the inner side regions 7a and 7b, which are on the lands 4a and 4b and to be below the chip part 5, using a thick film coating device such as a curtain coater, a spray coater, or a screen printer. Also, the lead-free solder pastes 22a and 22b are applied to the outer side regions 9a and 9b on the lands 4a and 4b. Further, the surface mounting substrate 1 is put in the reflow furnace in a condition in which the chip part 5 is placed on the thick film resist layers 8a and 8b and lead-free solder pastes 22a and 22b, and reflow-soldering is carried out.

Because of this, even when wetting-up occurs in the lead-free solder pastes 22a and 22b when the surface mounting substrate 1 is reflow-soldered, it is possible to reliably secure the lift-off height between the lands 4a and 4b and the chip part 5 with the thick film resist layers 8a and 8b.

Moreover, when carrying out the formation of the thick film resist layers 8a and 8b with the thick film coating device configured of a curtain coater or spray coater, it is possible to accurately adjust the thickness of the thick film resist layers 8a and 8b by controlling the speed of the conveyor which conveys the surface mounting substrate 1 placed thereon.

In the heretofore described embodiment, a description has been given of a case in which a common photosensitive resin composition is used as a resist. However, the invention not being limited to the heretofore described configuration, a filler-containing photosensitive resin composition wherein a filler is mixed in a photosensitive resin composition may be applied as a resin. In this case, as a filler-containing photosensitive resin composition is applied as a resist, it is possible, when forming the thick film resist layers 8a and 8b, to accurately form thick films of a thickness of 100 μm or more in a condition in which the thick films are maintained in shape without any droop.

Also, in the heretofore described embodiment, a description has been given of a case in which the thick film resist layer 21 is formed by one thick film coating process, but the invention not being limited to this, the thick film resist layer 21 may be formed by repeating the thick film coating process a plurality of times depending on the film thickness.

Furthermore, in the heretofore described embodiment, a description has been given of a case in which the thick film resist layers 8a and 8b are formed using a liquid photoimageable solder resist, but the invention not being limited to this, the thick film resist layers 8a and 8b may be formed using a dry film photoresist. In this case, it is only necessary to provide a step of forming a thick film resist layer by laminating a dry film photoresist of a desired thickness (for example, on the order of 100 μm), which secures stand-off height, to a mounting surface of a surface mounting substrate on which is formed a wiring pattern including a pair of lands on which to mount an electronic part, a step of exposing exposure regions using a mask with inner side regions of the formed thick film resist layer, which are on the lands and to be below the electronic part, as the exposure regions and with the other regions as non-exposure regions, a step of developing and removing the thick film resist layer in the non-exposure regions and thus forming thick film resist layers in the inner side regions which are on the pair of lands and to be below the electronic part, a step of post curing the thick film resist layers, a step of printing solder pastes in regions excluding the inner side regions on the lands, and a step of placing the electronic part on the solder pastes and carrying out reflow-soldering thereon. In this way, when using a dry film photoresist, it is possible to accurately and easily form the thick film resist layers 8a and 8b without using an expensive coating device.

INDUSTRIAL APPLICABILITY

According to the invention, as a thick film resist layer is formed in inner side regions which are on a pair of lands and to be below an electronic part on a mounting substrate, it is possible to provide a method of mounting electronic parts on a surface mounting substrate whereby it is possible to accurately set the stand-off height of a chip part.

REFERENCE SIGNS LIST

1 . . . Surface mounting substrate, 2 . . . Land, 3 . . . Large part, 4a, 4b . . . Land, 5 . . . Chip part, 6 . . . Solder layer, 6a, 6b . . . Wetting-up portion, 7a, 7b . . . Inner side region, 8a, 8b . . . Thick film resist layer, 9a, 9b . . . Outer side region, 10a, 10b . . . Solar layer, 11a, 11b . . . Wetting-up portion, 21 . . . Thick film resist layer, 22a, 22b . . . Lead-free solder paste

What is claimed is:

1. A method of mounting an electronic part on a surface mounting substrate, comprising:
    a step of forming a film resist layer by applying a resist to a mounting surface of a surface mounting substrate formed with a wiring pattern including a pair of lands to mount an electronic part, wherein the pair of lands has a space therebetween, and each land having an inner side region at one end of the land adjacent to the space, and an outer side region at another end of the land;
    a step of precuring the film resist layer;
    a step of applying a mask to expose the film resist layer located on the inner side regions of the pair of lands below the electronic part to be placed, and to cover a remaining region of the film resist layer including a region of the film resist layer located in the space between the pair of lands;
    a step of exposing the film resist layer through the mask, the inner side regions defining exposure regions and the remaining region of the film resist layer defining a non-exposure region;
    a step of etching away the film resist layer in the non-exposure region including the space between the pair of lands, and forming film resist layers on the inner side regions on the pair of lands below the electronic part to be placed;
    a step of post curing the film resist layer;
    a step of printing solder paste on the outer side regions on the pair of lands excluding the inner side regions of the pair of lands; and
    a step of placing the electronic part on the solder paste and reflow-soldering thereon.

2. A method of mounting the electronic part on the surface mounting substrate according to claim 1, wherein in the step of printing solder paste, the solder paste is applied on each of the pair of lands to have a height higher than that of the film resist layer.

3. A method of mounting the electronic part on the surface mounting substrate according to claim 2, wherein the electronic part has two electrode portions at two ends thereof, and when the electronic part is reflow-soldered, a portion of the solder paste disposed on each of the pair of lands wets up along the electrode portions, and a remaining portion of the solder paste remains on each of the pair of lands.

4. A method of mounting an electronic part on a surface mounting substrate, comprising:
- a step of forming a film resist layer by laminating a dry film photoresist to a mounting surface of a surface mounting substrate formed with a wiring pattern including a pair of lands to mount an electronic part, wherein the pair of lands has a space therebetween, and each land having an inner side region at one end of the land adjacent to the space, and an outer side region at another end of the land;
- a step of applying a mask to expose the Riled film resist layer located on the inner side regions of the pair of lands below the electronic part to be placed, and to cover a remaining region of the film resist layer including a region of the film resist layer located in the space between the pair of lands;
- a step of exposing the film resist layer through the mask, the inner side regions defining the exposure regions and the remaining region of the film resist layer defining a non-exposure region;
- a step of developing and removing the film resist layer in the non-exposure region including the space between the pair of lands, and forming film resist layers on the inner side regions on the pair of lands below the electronic part to be placed;
- a step of post curing the film resist layer;
- a step of printing solder paste on the outer side regions on the pair of lands excluding the inner side regions of the pair of lands; and
- a step of placing the electronic part on the solder paste and reflow-soldering thereon.

5. A method of mounting the electronic part on the surface mounting substrate according to claim 4, wherein in the step of printing solder paste, the solder paste is applied on each of the pair of lands to have a height higher than that of the film resist layer.

6. A method of mounting the electronic part on the surface mounting substrate according to claim 5, wherein the electronic part has two electrode portions at two ends thereof, and when the electronic part is reflow-soldered, a portion of the solder paste disposed on each of the pair of lands wets up along the electrode portions, and a remaining portion of the solder paste remains on each of the pair of lands.

* * * * *

UNITED STATES PATENT AND TRADEMARK OFFICE
CERTIFICATE OF CORRECTION

PATENT NO. : 9,144,186 B2
APPLICATION NO. : 14/505046
DATED : September 22, 2015
INVENTOR(S) : Kokichi Okamoto et al.

It is certified that error appears in the above-identified patent and that said Letters Patent is hereby corrected as shown below:

Title Page, item (57)

Please change ABSTRACT, line 3, from "... to amounting" to --... to a mounting--.

In the Claims

Please change column 7, line 16, from "... the Riled film resist" to --... the film resist--.

Signed and Sealed this
Ninth Day of February, 2016

Michelle K. Lee
*Director of the United States Patent and Trademark Office*